US011984185B2

(12) United States Patent
Wilson

(10) Patent No.: US 11,984,185 B2
(45) Date of Patent: May 14, 2024

(54) APPARATUSES AND METHODS FOR ZONE-BASED SOFT POST-PACKAGE REPAIR

(71) Applicant: MICRON TECHNOLOGY, INC., Boise, ID (US)

(72) Inventor: Alan J. Wilson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 2 days.

(21) Appl. No.: 17/224,897

(22) Filed: Apr. 7, 2021

(65) Prior Publication Data

US 2022/0328125 A1 Oct. 13, 2022

(51) Int. Cl.
*G11C 29/00* (2006.01)
*G11C 29/02* (2006.01)

(52) U.S. Cl.
CPC ............ *G11C 29/76* (2013.01); *G11C 29/025* (2013.01); *G11C 29/789* (2013.01)

(58) Field of Classification Search
CPC ..... G11C 29/76; G11C 29/025; G11C 29/789; G11C 29/4401; G11C 29/72; G11C 29/787
USPC .......................................................... 714/711
See application file for complete search history.

(56) References Cited

U.S. PATENT DOCUMENTS

| | | | |
|---|---|---|---|
| 3,886,323 A | 5/1975 | Miller et al. | |
| 5,278,839 A | 1/1994 | Matsumoto et al. | |
| 5,764,878 A | 6/1998 | Kablanian et al. | |
| 5,828,599 A * | 10/1998 | Herdt ................... | G11C 29/789 365/185.08 |
| 5,862,314 A | 1/1999 | Jeddeloh | |
| 5,910,921 A | 6/1999 | Beffa et al. | |
| 5,930,169 A | 7/1999 | Iwata et al. | |
| 5,974,564 A | 10/1999 | Jeddeloh | |
| 6,085,334 A | 7/2000 | Giles et al. | |
| 6,367,030 B1 | 4/2002 | Yamauchi | |

(Continued)

FOREIGN PATENT DOCUMENTS

| | | |
|---|---|---|
| CN | 1441437 A | 9/2003 |
| CN | 1784758 A | 6/2006 |

(Continued)

OTHER PUBLICATIONS

Application No. PCT/US20/15031, titled "Apparatuses and Methods for Soft Post-Package Repair", dated Jan. 24, 2020.

(Continued)

*Primary Examiner* — James C Kerveros
(74) *Attorney, Agent, or Firm* — Dorsey & Whitney LLP

(57) ABSTRACT

Embodiments of the disclosure are drawn to apparatuses and methods for soft post-package repair (SPPR). After packaging, it may be necessary to perform post-package repair operations on rows of the memory. During a scan mode of an SPPR operation, addresses provided by a fuse bank may be examined to determine if they are open addresses or if the bad row of memory is a redundant row of memory. The open addresses and the bad redundant addresses may be stored in volatile storage elements, such as in latch circuits. During a soft send mode of a SPPR operation, the address previously associated with the bad row of memory may be associated with the open address instead, and the address of the bad redundant row may be disabled.

19 Claims, 7 Drawing Sheets

(56) References Cited

U.S. PATENT DOCUMENTS

| | | |
|---|---|---|
| 6,408,401 B1 | 6/2002 | Bhavsar et al. |
| 6,490,219 B2 | 12/2002 | Yoneya et al. |
| 6,665,226 B2 | 12/2003 | Yoneya et al. |
| 6,967,878 B2 | 11/2005 | Dono |
| 7,020,033 B2 | 3/2006 | Nagata et al. |
| 7,076,699 B1 * | 7/2006 | Puri .................. G11C 29/44 714/710 |
| 7,260,758 B1 * | 8/2007 | Agrawal ............ G11C 29/56 714/733 |
| 7,350,119 B1 | 3/2008 | Zuraski, Jr. et al. |
| 7,436,222 B2 | 10/2008 | Shyr et al. |
| 7,437,626 B2 * | 10/2008 | Chang ................. G11C 29/44 714/733 |
| 7,535,780 B2 | 5/2009 | Lee |
| 7,536,267 B2 | 5/2009 | Zimmerman et al. |
| 7,606,102 B2 | 10/2009 | Blodgett |
| 7,684,266 B2 | 3/2010 | Lee |
| 7,746,712 B2 | 6/2010 | Kang et al. |
| 7,768,847 B2 | 8/2010 | Ong et al. |
| 8,086,916 B2 | 12/2011 | Kopel |
| 8,379,460 B2 | 2/2013 | Jeong |
| 8,559,258 B1 | 10/2013 | Stephens, Jr. |
| 8,593,891 B2 | 11/2013 | Nishioka et al. |
| 8,645,583 B2 | 2/2014 | Vu et al. |
| 9,202,595 B2 | 12/2015 | Wilson et al. |
| 9,343,184 B2 | 5/2016 | Wilson et al. |
| 9,349,491 B1 | 5/2016 | Morgan et al. |
| 9,418,762 B1 | 8/2016 | You |
| 9,514,849 B2 | 12/2016 | You et al. |
| 9,570,201 B2 | 2/2017 | Morgan et al. |
| 9,666,307 B1 | 5/2017 | Fujiwara et al. |
| 9,741,403 B2 | 8/2017 | Wilson et al. |
| 9,805,828 B1 | 10/2017 | Yoko |
| 9,922,729 B2 | 3/2018 | Wilson et al. |
| 10,832,791 B2 | 11/2020 | Wilson |
| 11,145,387 B2 | 10/2021 | Wilson |
| 2002/0019961 A1 | 2/2002 | Blodgett |
| 2002/0051400 A1 | 5/2002 | Yoneya et al. |
| 2002/0133769 A1 | 9/2002 | Cowles et al. |
| 2003/0031075 A1 | 2/2003 | Yoneya et al. |
| 2003/0038649 A1 | 2/2003 | D'Angelo |
| 2003/0164510 A1 | 9/2003 | Dono |
| 2004/0047192 A1 | 3/2004 | Haga |
| 2004/0261049 A1 | 12/2004 | Mohr et al. |
| 2005/0041491 A1 | 2/2005 | Kyung |
| 2005/0097383 A1 | 5/2005 | Puri et al. |
| 2005/0149782 A1 | 7/2005 | McPartland |
| 2006/0274594 A1 | 12/2006 | Huckaby et al. |
| 2007/0002646 A1 | 1/2007 | Martin et al. |
| 2007/0113121 A1 * | 5/2007 | Hummler ........... G11C 29/4401 714/710 |
| 2007/0183229 A1 | 8/2007 | Choi et al. |
| 2009/0282301 A1 | 11/2009 | Flynn et al. |
| 2010/0046292 A1 | 2/2010 | Hahn et al. |
| 2010/0124132 A1 | 5/2010 | Sarin et al. |
| 2011/0110164 A1 | 5/2011 | Jeong |
| 2011/0199811 A1 | 8/2011 | Kanno et al. |
| 2012/0027077 A1 | 2/2012 | Reznik |
| 2012/0054549 A1 | 3/2012 | Kwan et al. |
| 2012/0069638 A1 | 3/2012 | Matsuda et al. |
| 2012/0069685 A1 | 3/2012 | Ide et al. |
| 2012/0092943 A1 | 4/2012 | Nishioka |
| 2012/0195144 A1 | 8/2012 | Ide et al. |
| 2012/0267791 A1 | 10/2012 | Lee et al. |
| 2013/0055039 A1 | 2/2013 | Dearth |
| 2013/0083612 A1 | 4/2013 | Son et al. |
| 2013/0223171 A1 | 8/2013 | Kim et al. |
| 2013/0235644 A1 | 9/2013 | Chung |
| 2013/0339821 A1 | 12/2013 | Cordero et al. |
| 2014/0049854 A1 | 2/2014 | Ho |
| 2014/0078842 A1 | 3/2014 | Oh et al. |
| 2014/0140138 A1 | 5/2014 | Tran et al. |
| 2014/0211567 A1 | 7/2014 | Chung |
| 2014/0223257 A1 | 8/2014 | Oh et al. |
| 2015/0135038 A1 | 5/2015 | Wilson et al. |
| 2015/0277790 A1 | 10/2015 | Mozak et al. |
| 2015/0287480 A1 | 10/2015 | Wilson et al. |
| 2016/0078968 A1 | 3/2016 | Park et al. |
| 2016/0133310 A1 | 5/2016 | Wilson et al. |
| 2016/0232987 A1 | 8/2016 | Wilson et al. |
| 2016/0300627 A1 | 10/2016 | You et al. |
| 2016/0307647 A1 | 10/2016 | Morgan et al. |
| 2017/0098480 A1 | 4/2017 | Wilson et al. |
| 2018/0005710 A1 | 1/2018 | Wilson et al. |
| 2018/0075920 A1 | 3/2018 | Fujiwara et al. |
| 2018/0102185 A1 | 4/2018 | Yang |
| 2018/0166152 A1 | 6/2018 | Lee |
| 2018/0240534 A1 | 8/2018 | Yoko |
| 2018/0261297 A1 | 9/2018 | Kim |
| 2020/0243158 A1 | 7/2020 | Wilson |
| 2021/0020261 A1 | 1/2021 | Wilson |
| 2021/0174892 A1 | 6/2021 | Nadeau-Dostie |

FOREIGN PATENT DOCUMENTS

| | | |
|---|---|---|
| CN | 1945744 A | 4/2007 |
| CN | 101211656 A | 7/2008 |
| CN | 101253576 A | 8/2008 |
| CN | 101399088 A | 4/2009 |
| CN | 201828258 U | 5/2011 |
| CN | 102290104 A | 12/2011 |
| CN | 103295640 A | 9/2013 |
| CN | 106257595 A | 12/2016 |
| JP | 2002117694 A | 4/2002 |
| JP | 2012083243 A | 4/2012 |
| WO | 2016077248 A1 | 5/2016 |

OTHER PUBLICATIONS

U.S. Appl. No. 17/062,264 titled "Apparatuses and Methods for Soft Post-Package Repair" filed Oct. 2, 2020.
U.S. Appl. No. 15/703,223, entitled "Soft Post Package Repair of Memory Devices", filed Sep. 13, 2017.
U.S. Appl. No. 15/382,394, entitled "Soft Post Package Repair of Memory Devices", filed Dec. 16, 2016.
U.S. Appl. No. 16/161,932, titled "Intelligent Post-Packaging Repair", filed Oct. 16, 2018.
"Impact of I/O Settings on Signal Integrity in Stratix III Devices", Altera Corporation, Application Note 476, ver. 1.0, 15 pgs, Oct. 2007.
Cataldo, Anthony, "'Virage Logic Readies self-repairing embedded memory'", EE Times, Mar. 6, 2001, 2 pages. Available at: http://www.eetimes.com/document.asp?doc_id=1143164&print=yes (accessed, Apr. 10, 2014).
Cataldo, Anthony, "'Virage Logic Readies self-repairing embedded memory'", EE Times, Mar. 6, 2001, 2 pages. Available at: http:/www.eetimes.com/document.asp?doc_id=1143164&print=yes (accessed, Apr. 10, 2014)., Mar. 6, 2001, 2 pages.
Cataldo, Anthony, "'Virage Logic Readies self-repairing embedded memory,'", EE Times, Mar. 6, 2001, 2 pages, Mar. 6, 2001.
He, Chen, "Scalable Defect Mappying and Configureation of Memory-Based Nanofabrics", Tenth IEEE International High-level Design Validation and Test Workshop, Jan. 2006.
Wu, Zhiwei, et al., "Built in Self-Repair Design of Embedded Memory", Microelectronics and Computer, Issue 2, Mar. 2007.

* cited by examiner

APPARATUSES AND METHODS FOR ZONE-BASED SOFT POST-PACKAGE REPAIR

BACKGROUND

This disclosure relates generally to semiconductor devices, and more specifically to semiconductor memory devices. In particular, the disclosure relates to memory, such as dynamic random access memory (DRAM). Information may be stored in memory cells, which may be organized into rows (word lines) and columns (bit lines). At various points in manufacturing and use of a memory device, one or more memory cells may fail (e.g., become unable to store information, be inaccessible by the memory device, etc.) and may need to be repaired.

The memory device may perform repair operations on a row-by-row basis. A row containing a failed memory cell (which may be referred to as a defective row, a bad row, or a faulty row) may be identified. The memory device may contain additional rows of memory (which may also be referred to as redundant rows) which may be used in repair operations. During a repair operation, an address associated with the defective row may be redirected, such that the address points to a redundant row instead. It may be desirable to increase the flexibility of repair operations, such that repairs may be tested before they are permanently implemented on the memory device.

DETAILED DESCRIPTION

Figure 1:
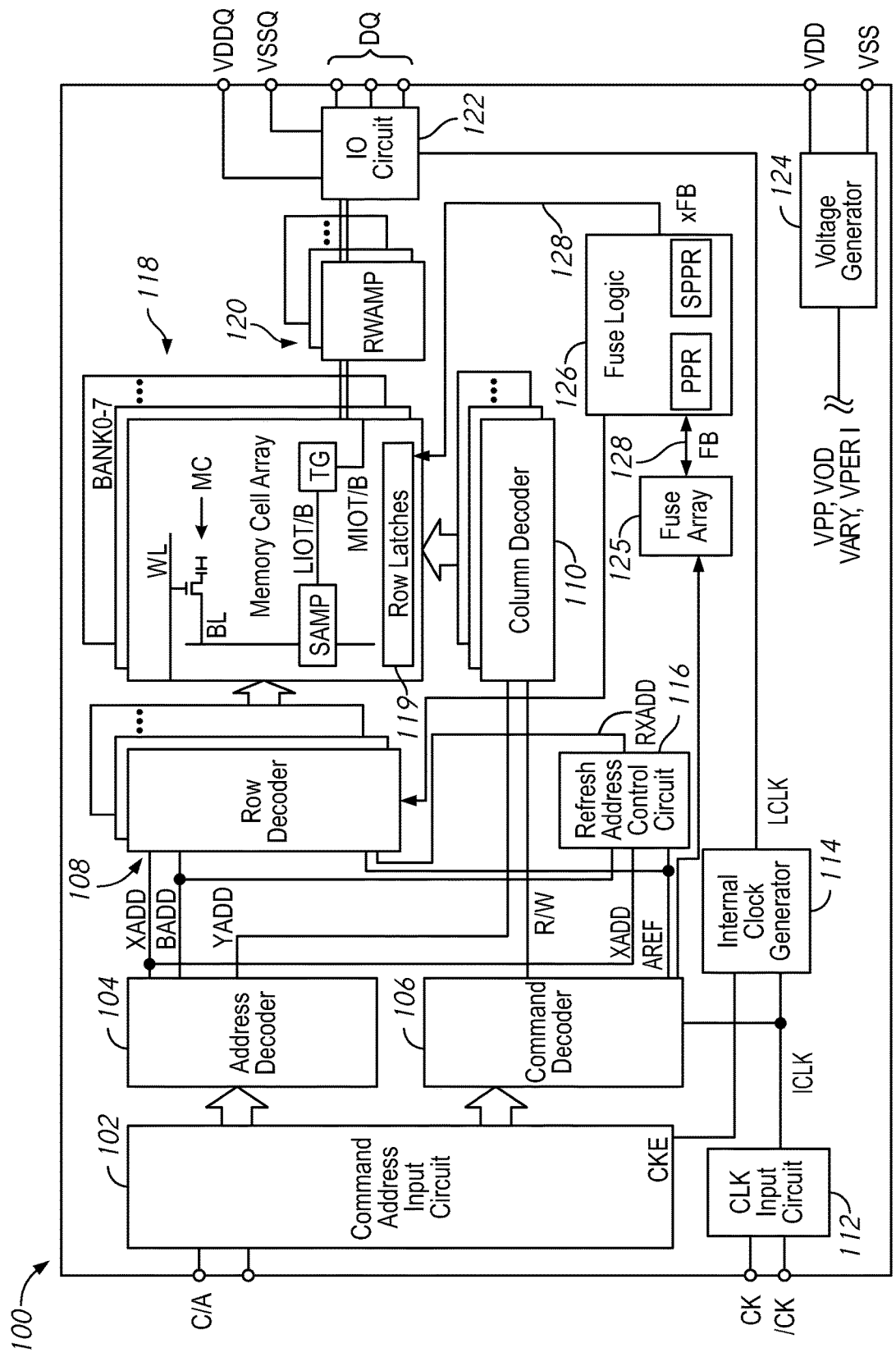
FIG. 1 is a block diagram of a semiconductor device according to some embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Semiconductor memory devices may store information in a plurality of memory cells. The information may be stored as a binary code, and each memory cell may store a single bit of information as either a logical high (e.g., a "1") or a logical low (e.g., a "0"). The memory cells may be organized at the intersection of word lines (rows) and bit lines (columns). The memory may further be organized into one or more memory banks, each of which may include a plurality of rows and columns. During operations, the memory device may receive a command and an address which specifies one or more rows and one or more columns and then execute the command on the memory cells at the intersection of the specified rows and columns (and/or along an entire row/column).

Certain memory cells may be defective, and rows containing the defective memory cells may generally be referred to as defective rows (or bad rows or faulty rows). The defective rows may be incapable of storing information and/or may become otherwise inaccessible to the memory device. In some cases, memory may become defective (and/or may be identified as defective) after the memory device is packaged (e.g., sealed in a chip package). The memory device may carry out one or more types of post-package repair (PPR) operation to resolve the defective rows.

For example, memory banks may generally include a number of additional rows of memory, which may generally be referred to as redundant rows. During a repair operation, a row address associated with a defective row may be redirected so that it is associated with one of the redundant rows instead. In some modes of operation, the repair operation may be a hard (or permanent) repair operation, where updated row address information is stored in the memory in a non-volatile form (e.g., stored in a manner that is maintained even when the memory device is powered down). For example, the memory device may include a fuse array, which may include fuses (and/or anti-fuses) which may have state that can be permanently changed (e.g., when the fuse/anti-fuse is "blown"). For the sake of brevity, the term 'fuse' as used herein may be understood to include any non-volatile storage element, such as a fuse, anti-fuse, etc. The state of the fuses in the fuse array may, in part, determine which addresses are associated with which rows of memory.

During a soft PPR operation (an SPPR operation) non-volatile elements may be used to track repairs. During an SPPR operation performed on a given row, a fuse bank associated with the bank of the memory array which includes the identified row may be scanned to locate an open redundant row (e.g., one where the fuses for that redundant row indicate the redundant row has not already been used for a repair operation). The address of the open redundant row and the address of the row to be repaired may be stored in non-volatile elements (e.g., latch circuits) so that information which would have been directed to the row to be repaired is directed to the redundant row instead. A problem may occur if multiple SPPR operations are performed, as none of the SPPR operations will cause changes to the fuse array, which in some circumstances may cause a redundant row to be identified as open, even if it has been used as part of a previous SPPR operation. Accordingly, there is a need for managing SPPR operations in a manner which does not allow for conflicts between SPPR operations.

The present disclosure is generally directed to zone-based soft post package repair (SPPR). During a first SPPR operation, scan logic of the memory may scan a first portion or zone of the fuse bank to locate an open redundant row. If an open row is located, it may be used as part of a repair. During a second SPPR operation, scan logic of the memory may scan a second portion or zone of the fuse bank to locate an open redundant row. The second portion may be non-overlapping with the first portion. In this manner, although the state of the fuse array does not change, the same open redundant row will not be identified in different SPPR operations since each redundant row is associated with only one zone.

In some embodiments, the fuse array may be divided into a number of zones or portions based on the number of SPPR operations which can be performed (which may be set by a specification of the device). Each time an SPPR operation is performed, a count may be updated. The count may be used to determine which portion of the fuse array (e.g., which set of redundant rows) is searched. Since the number of portions is based on a total number of SPPR operations which can be performed, each SPPR operation will involve searching for an open redundant row in a different region from each other SPPR operation. This may allow for a simplification of other aspects of the logic used to carry out the SPPR operation, while still allowing multiple SPPR operations to be performed by the memory device. In some embodiments, there may be different counters for different banks of the memory, each of which may count a number of SPPR operations performed on that bank. Since the currently searchable portion of each bank is tracked separately, it may allow for interleaving of SPPR operations between banks.

FIG. 1 is a block diagram of a semiconductor device according to at least some embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL and/BL, and a plurality of memory cells MC arranged at intersections of the plurality of word lines WL and the plurality of bit lines BL and/BL. The selection of the word line WL is performed by a row decoder 108 and the selection of the bit lines BL and/BL is performed by a column decoder 110. In the embodiment of FIG. 1, the row decoder 108 includes a respective row decoder for each memory bank and the column decoder 110 includes a respective column decoder for each memory bank. The bit lines BL and/BL are coupled to a respective sense amplifier (SAMP). Read data from the bit line BL or/BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or /BL.

The device also includes a fuse array 125, which contains a plurality of non-volatile storage elements (fuses) which may store information about addresses in the memory array 118. Each fuse may start in a first state (e.g., an anti-fuse may be insulating), and may be 'blown' to permanently change the fuse's state (e.g., a blown anti-fuse may be conductive). Each fuse may be considered to be a bit, which is in one state before it is blown, and permanently in a second state after it's blown. For example, a fuse may represent a logical low before it is blown and a logical high after it is blown.

Specific groups of fuses may be represented by a fuse bank address FBA, which may specify the physical location of each of the fuses in the group within the fuse array 125. The group of fuses associated with a particular FBA may act as a row repair element (RRE). The RRE may be encoded with a row address to be repaired (e.g., by blowing fusing to encode a binary string of the row address). The RRE may be associated with a particular redundant row of the memory array 118. The address information in the fuse array 125 may be 'scanned' out along a fuse bus (FB and xFB) 128 to row latches 119. Each row latch 119 may be associated with a particular wordline of the memory array 118. In some embodiments, only the redundant rows of the memory array 118 (e.g., the rows designated for use in repair operations) may be associated with one of the row latches 119. The address stored in a given RRE may be scanned out from the fuse array 125 along the fuse bus 128, and may be latched by a particular row latch 119. In this manner, an address stored in an RRE the fuse array 125 may be associated with a particular row of the memory array 118. The address stored in the row latch 119 may then direct access commands to the wordlines associated with the row latch 119.

The fuse array 125 may be divided into different sections. For example, each bank of the memory array 118 may be associated with a fuse bank of the fuse array 125, which may store information related to that memory bank. Each fuse bank may have a number of RREs based on a number of repair operations (e.g., a number of redundant rows) which are associated with that memory bank.

A fuse logic circuit 126 may be positioned along the fuse bus 128. The fuse logic circuit 126 may include post package repair (PPR) circuits (e.g., hard PPR circuits) which may be used to make changes to the fuse array 125. For example, the PPR circuits may perform a hard repair, where fuses in an RRE the fuse array 125 are blown to 'repair' a row by encoding the repaired row address permanently into the RRE. As described in more detail herein, the fuse logic circuit 126 may also include soft PPR circuits (SPPR circuits) and volatile memory elements which may be used to make non-permanent repairs. The fuse logic circuit 126 may monitor the data along the fuse bus 128 and may selectively alter the data to provide an altered fuse bus xFB.

A row address RA associated with a defective row of memory may be provided to the fuse logic circuit 126. The fuse logic circuit 126 may be commanded to perform an SPPR operation. During a scan mode of the SPPR operation, the fuse logic circuit 126 may 'scan' a zone (or portion) the fuse array 125 to locate an RRE in that zone which is not yet associated with a repaired memory address (generally referred to as an open RRE). An FBA associated with the open RRE (e.g., an open fuse bank address) may then be stored in one of a set of volatile memory elements of the fuse logic circuit 126 (e.g., a latch bank). During the scan mode, the fuse logic circuit 126 may also perform other operations, such as determining if a redundant row of memory is itself a defective row of memory (e.g., if the RA was previously received to be repaired, indicating that the redundant row the RA was assigned to by the first repair is itself defective). Identified defective rows of redundant memory may also be saved in the latch bank (or a second latch bank) of the fuse logic circuit 126. Defective rows of redundant memory may be disabled, to prevent future SPPR operations from using those rows.

Each time an SPPR operation is performed, a different zone of the fuse array 125 may be scanned. For example, during a first SPPR operation, a first set of RREs associated with a fuse bank may be scanned, during a second SPPR operation a second set of RREs associated with the fuse bank may be scanned, and so forth. Each set of RREs may be non-overlapping with each other. There may be a number of zones based on a number of SPPR operations which are supported. In this manner, each SPPR operation may use a non-overlapping set of RREs, and thus, no two SPPR operations should identify the same open RRE. In some embodiments, the entire set of RREs may be scanned during each SPPR operation to determine if the row address is associated with a defective row of memory.

Once an open RRE is located (if any are available in the scanned section), the fuse logic circuit 126 may also perform a 'soft send' operation, in which the fuse logic circuit 126 changes address information stored in the row latches 119 of the memory. Each of the row latches 119 may store the row address associated with a physical row associated with the given row latch 119. The address in the row latch 119 may then be used to during operations to determine which physical row is associated with a given address. During the soft send operation, the fuse logic circuit 126 may compare the addresses broadcast on the fuse bus 128 to the address(es) stored in the primary latch(es). When there is a match, a multiplexer may alter the address being broadcast and cause the altered address to be latched in the row latch 119 instead. For example, the row address associated with the defective row of memory may be provided to a row latch 119 associated with the open fuse bank in the primary latch circuit. This may repair the row address RA such that it is now associated with the redundant row associated with the open fuse bank instead of the defective row it was previously associated with. If the address is associated with a defective redundant row, the address of the defective redundant row address may be changed to mark it as disabled.

In this manner, volatile memory elements may be used to non-permanently repair rows of the memory. The logic circuits to perform the SPPR operation may be located in the fuse logic circuit 126, which may offer space savings, as the fuse logic circuit 126 may be in a less congested area of the memory device 100 than logic circuits associated with the memory array 118, such as bank logic circuits. In addition, the use scanning different zones for each SPPR operation to locate open RREs may reduce the number of latches and comparator circuits needed to manage multiple SPPR operations, which may in turn reduce the complexity and size of the fuse logic circuits. Further since open fuse banks are scanned for and identified, there may be no need for redundant rows to be specifically designated for post-package repair operations. In some embodiments, after a certain number of SPPR operations, the fuse logic circuit 126 may perform one or more hard PPR operations and may make permanent changes to the fuse array 125. In some embodiments, the hard PPR may be based on the repairs made during the SPPR operations.

The semiconductor device 100 may employ a plurality of external terminals that include command and address (C/A) terminals coupled to a command and address bus to receive commands and addresses, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a row activation command ACT. When the row activation command ACT is received, a bank address BADD and a row address XADD are timely supplied with the row activation command ACT.

The device 100 may receive an access command which is a read command. When a read command is received, a bank address BADD and a column address YADD are timely supplied with the read command, read data is read from memory cells in the memory array 118 corresponding to the row address XADD and column address YADD. For example, the row decoder may access the wordline associated with the row latch 119 which has an address which matches XADD. The read command is received by the command decoder 106, which provides internal commands so that read data from the memory array 118 is provided to the read/write amplifiers 120. The row decoder 108 may match the address XADD to an address stored in a row latch 119, and then may access the physical row associated with that row latch 119. The read data is output to outside from the data terminals DQ via the input/output circuit 122.

The device 100 may receive an access command which is a write command. When the write command is received, a bank address BADD and a column address YADD are timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. The row decoder 108 may match the address XADD to an address stored in a row latch 119, and then access the physical row associated with that row latch 119. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The device 100 may also receive commands causing it to carry out an auto-refresh operation. The refresh signal AREF may be a pulse signal which is activated when the command decoder 106 receives a signal which indicates an auto-refresh command. In some embodiments, the auto-refresh command may be externally issued to the memory device 100. In some embodiments, the auto-refresh command may be periodically generated by a component of the device. In some embodiments, when an external signal indicates a self-refresh entry command, the refresh signal AREF may also be activated. The refresh signal AREF may be activated once immediately after command input, and thereafter may be cyclically activated at desired internal timing. Thus, refresh operations may continue automatically. A self-refresh exit command may cause the automatic activation of the refresh signal AREF to stop and return to an IDLE state.

The refresh signal AREF is supplied to the refresh address control circuit 116. The refresh address control circuit 116 supplies a refresh row address RXADD to the row decoder 108, which may refresh a wordline WL indicated by the refresh row address RXADD. The refresh address control circuit 116 may control a timing of the refresh operation, and may generate and provide the refresh address RXADD. The refresh address control circuit 116 may be controlled to change details of the refreshing address RXADD (e.g., how the refresh address is calculated, the timing of the refresh addresses), or may operate based on internal logic. In some embodiments, the refresh address control circuit 116 may perform both auto-refresh operations, where the wordlines of the memory array 118 are refreshed in a sequence, and targeted refresh operations, where specific wordlines of the memory are targeted for a refresh out of sequence from the auto-refresh operations.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
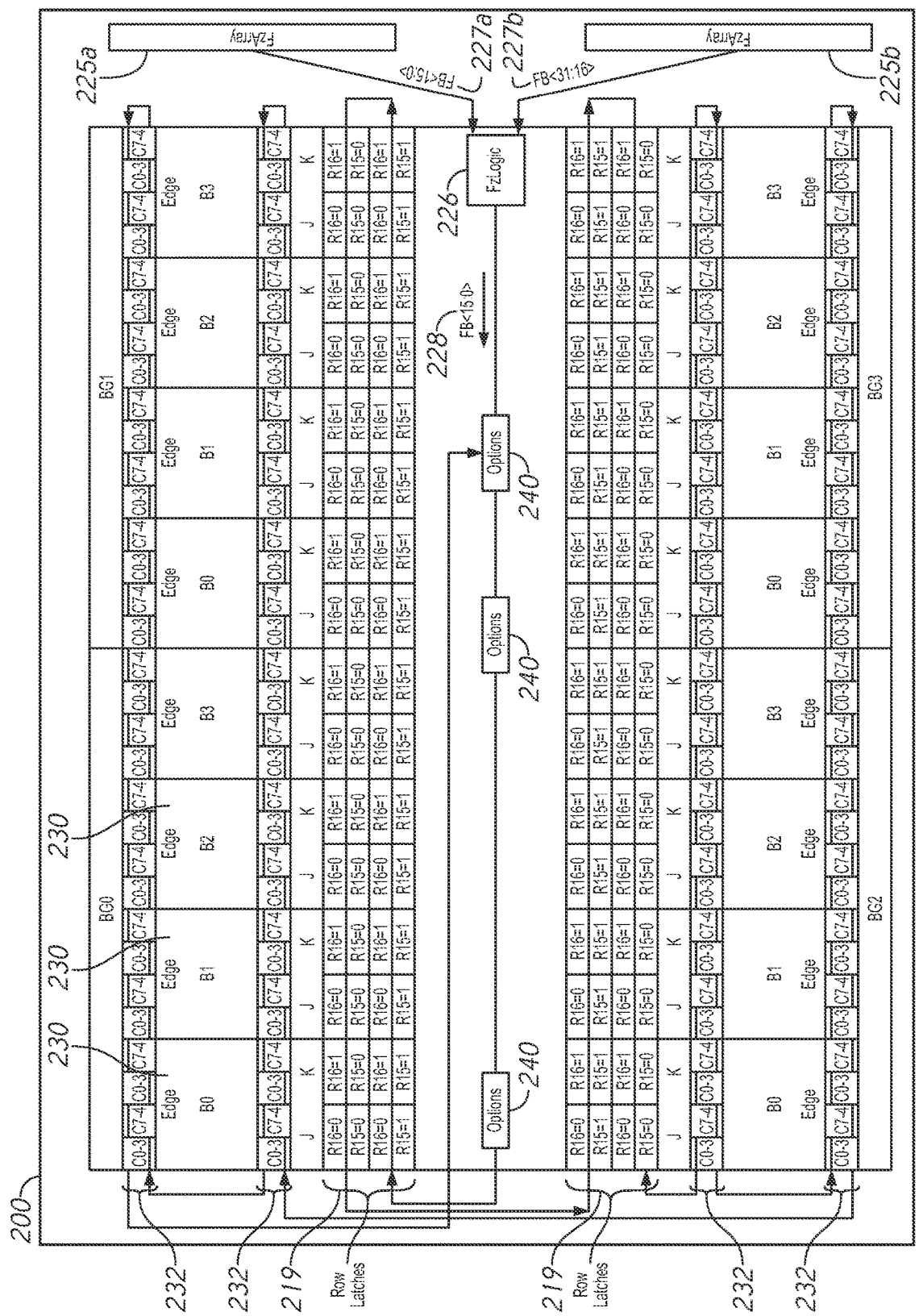
FIG. 2 is a block diagram representing a memory device according to some embodiments of the present disclosure.

FIG. 2 is a block diagram representing a memory device according to some embodiments of the present disclosure. FIG. 2 shows the transmission path of a fuse bus 228 from a pair of fuse arrays 225*a* and 225*b* through a memory array 200. In some embodiments, the memory array 200 may be an implementation of the memory array 118 of FIG. 1. However, the memory array 200 includes 16 banks 230 rather than the eight banks previously described with reference to the memory array 118. The 16 banks 230 are organized into four bank groups (BG0-BG3) of four banks 230 each. Each of the banks 230 is associated with a set of row latches 219 and column latches 232. Accordingly, although not shown in FIG. 2, each fuse bank of the fuse array 225 may have a number of RREs based on the number of row latches 219 associated with a bank 230.

Addresses may be scanned out along a fuse bus 228 from the fuse array 225*a-b*. In the particular embodiment of FIG. 2, there may be a pair of fuse arrays 225*a* and 225*b*. The fuse array 225*a* may include a set of anti-fuses which may generally be used to store address information for a first portion of row addresses. The fuse array 225*b* may include a set of fuses which may generally be used to store address information for a second portion of row addresses. In some embodiments, the row addresses may be divided between the first portion and the second portion based on a numerical value assigned to the address. For example, the addresses may be sorted by numerical value, row addresses with the smaller values may be assigned to fuse array 225*a*, while row addresses with the larger values assigned to fuse array 225*b*. Since the value of the address may be expressed as a number in binary, for numbers with a high value, most of the bits of the number may be at a high logical level, while numbers with a low value may have most of the bits at a low logical level. Thus, it may be more efficient to store high value addresses in the fuse array 225*b*, which includes fuses that default to a high logical level and low value addresses in the fuse array 225*a*, which includes anti-fuses which default to a low logical level. Thus, a high value address assigned to the fuse array 225*b* may require less fuses to be blown than it would require anti-fuses to be blown in the fuse array 225*a*.

In some embodiments, the fuse array 225*a* may include anti-fuses, and may be a non-inverting fuse array (since the default value of the anti-fuses is a low logical level) and the fuse array 225*b* may include fuses and be an inverting fuse array. It may be necessary to 'invert' an address (e.g., swap low logical levels for high logical levels and vice versa) before providing an address based on the inverting fuse array 225*b*.

While the organization of fuse arrays 225*a* and 225*b* will continue to be discussed herein as an example implementation, it should be understood that other methods of organizing addresses in the fuse array(s) may be used in other embodiments. For example, a single fuse array may be used with only fuses, only anti-fuses, or a mix thereof.

During a broadcast operation, such as a scan operation or a soft send operation, the fuse arrays 225*a-b* may broadcast the row addresses stored in the fuse arrays 225*a-b* along the fuse bus 228. The fuse array 225*a-b* may begin a broadcast operation as part of a scan mode of an SPPR operation, as discussed further herein. In the particular embodiment of FIG. 2, during the broadcast operation the fuse logic circuit 226 may receive a portion of the addresses along fuse bus portion 227a from the fuse array 225a, and a portion of the addresses along fuse bus portion 227b from the fuse array 225b. The fuse logic circuit 226 may combine the addresses onto the fuse bus 228 by alternating whether the addresses from the first fuse bus portion 227a or the second fuse bus portion 227b are provided along the fuse bus 228. For clarity, the addresses provided along the fuse bus portion 227a may be referred to as 'even' addresses and the addresses provided along the fuse bus portion 227b may be referred to as 'odd' addresses. It should be understood that even and odd addresses refers to the fuse array 225a-b the address is stored in, and that both fuse bus portions 227a-b may include addresses with numerical values which are both even and odd.

As previously described, the fuse logic circuit 226 may provide data along the fuse bus 228. The fuse logic circuit 226 may alternate between providing the even addresses from fuse bus portion 227a and the odd addresses from fuse bus portion 227b along the fuse bus 228. The fuse logic circuit 226 may also perform one or more operations based on the data of the fuse bus. For example, during a repair operation, the fuse logic 226 may change the value of a particular address as it streams past on the fuse bus 228.

After leaving the fuse logic circuit 226, the fuse bus 228 may pass data through one or more options circuits 240. The options circuits 240 may include various settings of the memory which may interact with the addresses along the fuse bus 228. For example, the options circuits 240 may include fuse settings, such as the test mode and power supply fuses. Data stored in the fuse arrays 225a-b may be latched and/or read by the options circuits 240, which may then determine one or more properties of the memory based on the options data provided along the fuse bus 228.

After passing through the options circuits 240 the fuse bus 228 may pass through the row latches 229 for all of the memory banks 230 before passing through the column latches 232 for all of the memory banks 230. As well as providing data (including address data) along the fuse bus 228, the fuse logic circuit 226 may also provide one or more select signals along the fuse bus 228. The select signals may be associated with a particular packet of data along the fuse bus, and may determine which circuit along the fuse bus 228 the particular packet of data is associated with. For example, if a row latch select signal is in an active state, it may indicate that the packet of data is to be stored in a row latch 229. In some embodiments, this may overwrite an address already stored in the row latch 229 with the address from the fuse bus 228. Further select signals may be used to specify a particular location of the specific row latch 229 which is intended to store the packet of data (e.g., a bank group select signal, a bank select signal, etc.).

By monitoring the data on the fuse bus 228, providing specific select signals, and selectively altering certain data on the fuse bus 228, the fuse logic circuit 226 may perform a variety of repair operations on the memory.

Figure 3:
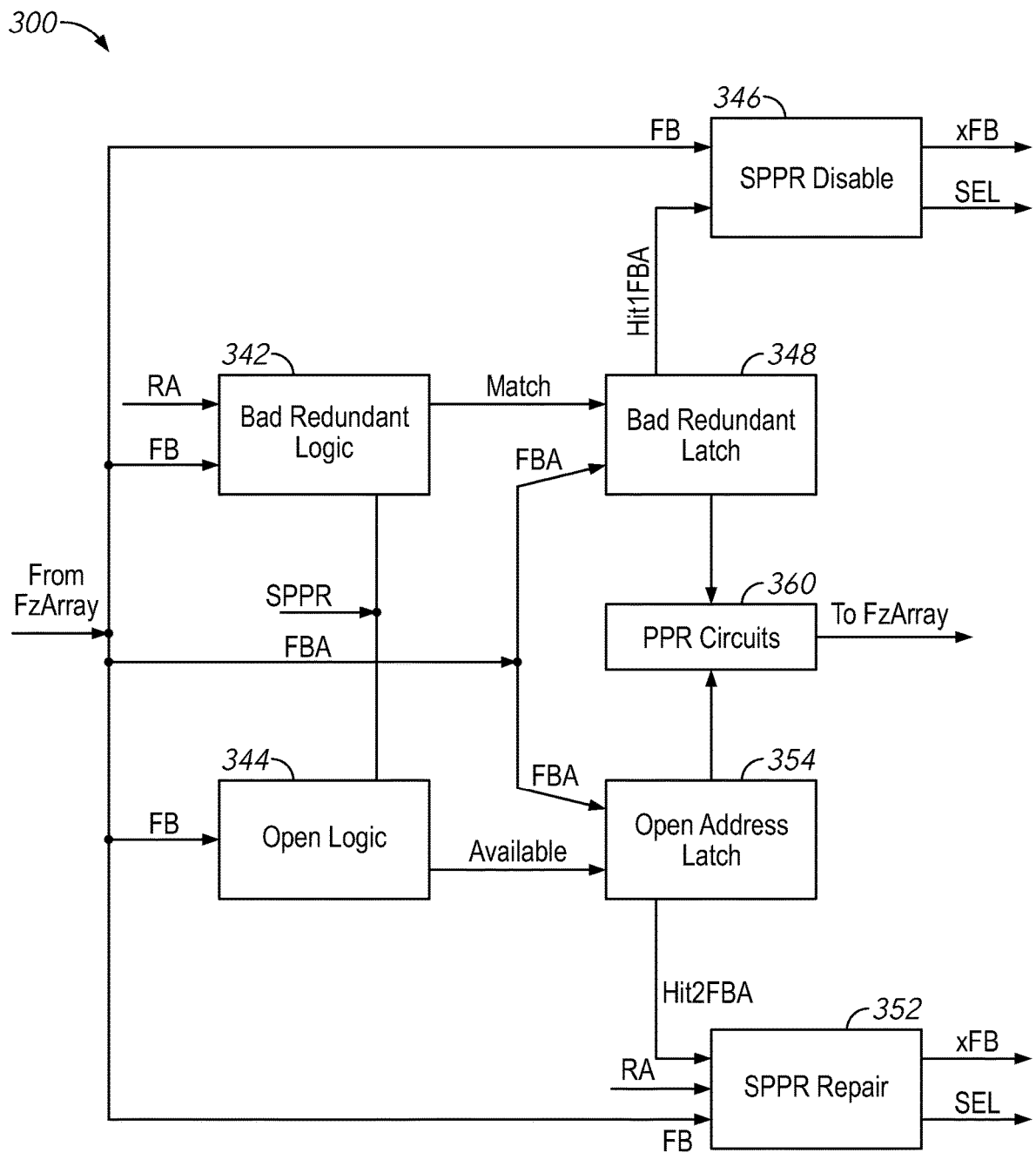
FIG. 3 is a block diagram depicting a fuse logic circuit according to some embodiments of the present disclosure.

FIG. 3 is a block diagram depicting a fuse logic circuit according to some embodiments of the present disclosure. In some embodiments the fuse logic circuit 300 may be used to implement the fuse logic circuit 126 of FIG. 1 and/or the fuse logic circuit 226 of FIG. 2. The fuse logic circuit 300 may be used to carry out a soft post-package repair (SPPR) operation. The SPPR operation may include receiving a row address RA of a bad row of the memory (e.g., a defective row of memory). During the SPPR operation, the fuse logic circuit may perform a scan mode operation and determine if the RA is itself a redundant row used in an earlier repair, indicating a bad redundant row and also may search for an open (e.g., unused) row of redundant memory. The fuse logic circuit 300 may then perform a soft send operation and disable an identified bad redundant row and repair the row address RA by assigning the row address RA to an unused row of redundant memory.

The fuse logic 300 is coupled to a fuse bus FB, which provides information from the fuse array during a scan or broadcast operation. Information along the fuse bus may include the state of a given set of fuses and the fuse bus address (FBA) of that set of fuses. For example, an RRE may be identified by a given FBA, and the state of fuses within the RRE may indicate if that RRE has been used for a repair operation (e.g., with an enable bit) and also which row address has been mapped to the RRE.

The fuse logic 300 includes a first logic circuit 342, which may generally be referred to as bad redundant logic circuit 342 and a first latch 348, which may generally be referred to as the bad redundant latch 348. The bad redundant latch 348 stores the fuse bank address FBA associated with bad redundant rows (e.g., redundant rows used for a repair which are now themselves defective) as indicated by the bad redundant logic 342. The bad redundant latch 348 may provide a bad redundant address Hit1FBA to an SPPR disable circuit 346, which may perform an SPPR operation to disable the bad redundant row based on the provided address.

The fuse logic 300 also includes a second logic circuit 344, which may generally be referred to as an open bank logic circuit 344 and a second latch 354 which may generally be referred to as the open address latch 354. The open address latch 354 may store a fuse bank address FBA associated with an open RRE (e.g., an RRE associated with a redundant row which has not been used for a repair operation) identified by the open address logic 344. The open address latch 354 may provide an open address Hit2FBA to an SPPR repair circuit 352, which may perform an SPPR operation based on the provided address.

The fuse logic circuit 300 may also include one or more PPR circuits 360, which may perform one or more hard repair operations on the fuse array (e.g., fuse array 125 of FIG. 1). In some embodiments, the PPR circuit 360 may perform hard PPR operations based on one or more of the addresses stored in the latches 348 and/or 354.

The fuse logic circuit 300 may receive one or more enable signals Enable (not shown). In some embodiments, the Enable signal may be provided by the command decoder (e.g., command decoder 106 of FIG. 1) responsive to one or more external commands. The state of Enable may be used to control operations of the fuse logic circuit 300 during a SPPR operation. For example, Enable may include an overall enable signal, which may be active to indicate a SPPR operation. Individual enable signals may be used for each of the scan mode operation, shift mode operation, and soft send mode operation as described in more detail in FIG. 6. In some embodiments, the fuse logic circuit 300 may receive an overall enable signal, and internal logic may be used to manage the enable signals for each of the operations of the SPPR operation.

During a SPPR operation, the fuse logic 300 may receive the fuse bus FB from the fuse array (e.g., fuse array 125 of FIG. 1 and/or fuse arrays 225a-b of FIG. 2). The bad redundant logic 342 and the open logic 344 may examine the data on the data along the fuse bus FB, while the SPPR disable 346 and SPPR repair circuits 352 may change the data on the fuse bus and provide an updated fuse bus data stream xFB. As described in more detail herein, the open logic 344 may include a counter which increments each time an SPPR operation is performed. The value of the count may be used to determine portion of the fuse bank is scanned for open RREs. In some embodiments, open logic 344 may increment the counter each time an SPPR operation ends. In contrast, the bad redundant logic 342 may not have a counter, and may scan the entire fuse bank as part of each scan operation.

The open logic 344 may include a count value for each bank of the memory array (e.g., 118 of FIG. 1) and the associated fuse bank with that bank of the memory array. Each SPPR operation may be specific to a particular bank (e.g., as specified by a bank address which accompanies the row address RA). The open logic may search a portion of the fuse bank associated with the selected bank based on a count of the number of SPPR operation which have been performed on that bank. For example, a first count may track a number of SPPR operations in a first bank, a second count may track a number of SPPR operations in a second bank, etc. The counts may be separately managed, and accordingly, different SPPR operations in different banks may search different portions of their respective banks. In some embodiments, one or more of the components of the fuse logic 300 may be repeated for different banks. For example each bank may have a respective open address logic 344, open address latch 354, etc. In some embodiments, one or more of the components of the fuse logic 300 may be shared between different banks. For example, the PPR circuits 360 may be shared.

The bad redundant logic 342 may receive a row address RA which is associated with a bad row of memory. The row address RA may be stored in a latch circuit of the fuse logic circuit 300, outside of either of the latches 348, 354. The row address RA may be provided from outside the fuse logic. For example, logic of the memory device may identify a bad row of memory, and provide the RA associated with that bad row of memory. In some embodiments, external testing may determine a bad row, and the RA may be provided as part of an external repair command.

An SPPR operation may include a scan mode operation, which may involve the fuse array broadcasting addresses along the fuse bus. During the scan mode, the bad redundant logic 342 may compare the RA to the addresses streaming along the FB. A match between an address on the fuse bus FB and the RA may indicate that the RA is associated with a redundant row of memory, and thus that the redundant row of memory associated with RA is itself a bad row of memory. The bad redundant logic 342 may provide the signal match at an active level to indicate that there is a match between the RA and the current address on the fuse bus FB.

The bad redundant latch bank 348 may store a fuse bank address FBA based on the state of the signal match. When match is at an active level, the current FBA may be stored in the bad redundant latch bank 348. The stored FBA may be associated with the address identified as a bad redundant by the bad redundant logic 342.

In addition, during the scan mode operation the open address logic 344 may scan the addresses provided on the fuse bus FB and search for an open fuse bank. The open address logic 344 may check a specific portion of values of the addresses along the fuse bus (e.g., a first range of FBA values). The open address logic 344 may ignore FBAs which are not in the currently searched portion. The open fuse bank address may represent the address of an open RRE in the fuse array. The open address logic 344 may provide a signal Available at an active state to indicate that the current address on the fuse bus FB is an open address. When Available is in an active state, the open address latch bank 354 may latch a fuse bank address FBA value into the latch 356. The latched FBA may be associated with the open address identified by the open logic circuit 344. The FBA may be latched into the open address fuse latch 354.

Once the scan mode is complete, the fuse logic 300 may perform a soft send operation, where disable and/or repair operations are performed on the address provided by the bad redundant fuse latch 348 and the open address fuse latch 354 respectively. During the soft send mode, the fuse array may begin broadcasting addresses along the fuse bus FB again. This second broadcast may generally be similar to the one during the scan mode operation, except that the SPPR disable circuit 346 and the SPPR repair circuit 352 may be active instead of the bad redundant logic circuit 342 and the open address logic circuit 344.

The SPPR disable circuit 346 may examine addresses which are streaming on the fuse bus FB. The addresses on the fuse bus FB may be compared to the address Hit1FBA provided by the bad redundant latch bank 348. A match between the address on FB and Hit1FBA may indicate that the current address on FB is the previously identified bad redundant row. The SPPR disable circuit 346 may alter the address on the FB and provide an updated address on the fuse bus xFB. In particular, the SPPR disable circuit 346 may disable the address which matches Hit1FBA, the identified bad redundant row. For example, in one embodiment, the SPPR disable circuit 346 may change the state of an enable bit in the address before providing it along the updated fuse bus xFB. The SPPR disable circuit 346 may also provide the select signal which matches the row latch associated with the identified bad redundant row, such that the disabled row address is latched by the row latch.

The SPPR repair circuit 352 may examine the addresses which are streaming on the fuse bus FB and compare them to the fuse bus address Hit2FBA provided by the open address latch bank 354. A match may indicate that the current address on the fuse bus FB corresponds to an open address as previously determined by the open logic circuit 344 during the scan mode. When there is a match, the SPPR repair circuit 352 may repair the provided row address RA by mapping it onto the open address. The SPPR repair circuit 352 may also provide a select signal corresponding to the row latch associated with the repair, such that the row address RA is latched by the associated row latch. In some embodiments, the SPPR repair circuit 352 may replace the value of the open address on the fuse bus FB with the row address RA, and then may provide RA as part of the updated fuse bus xFB. RA may then be latched in row latch (e.g., row latch 119 of FIG. 1 and/or 219 of FIG. 2) that was previously associated with Hit2FBA such that RA is now associated with that redundant row of memory. The SPPR repair logic 352 may mask other addresses along the fuse bus FB, so as to preserve any previous SPPR repairs which were made.

In some embodiments the fuse logic circuit 300 may also include PPR circuits 360. The PPR circuits 360 may be used to perform a hard repair, by blowing one or more fuses/anti-fuses in the fuse array. In some embodiments, the PPR circuits 360 may perform hard repairs based on the addresses stored in the bad redundant latch bank 348 and/or open address latch bank 354. In some embodiments, the count control circuit 358 may determine when a number of SPPR operations have been performed such that all of the latches in the latch banks 348 and/or 354 are full. The PPR circuit 360 may then be triggered to perform a hard repair on the addresses stored in those banks. In some embodiments, the latches 348 and 354 may be cleared once a hard repair has been made based on the addresses in the latches 348 and 354.

Figure 4:
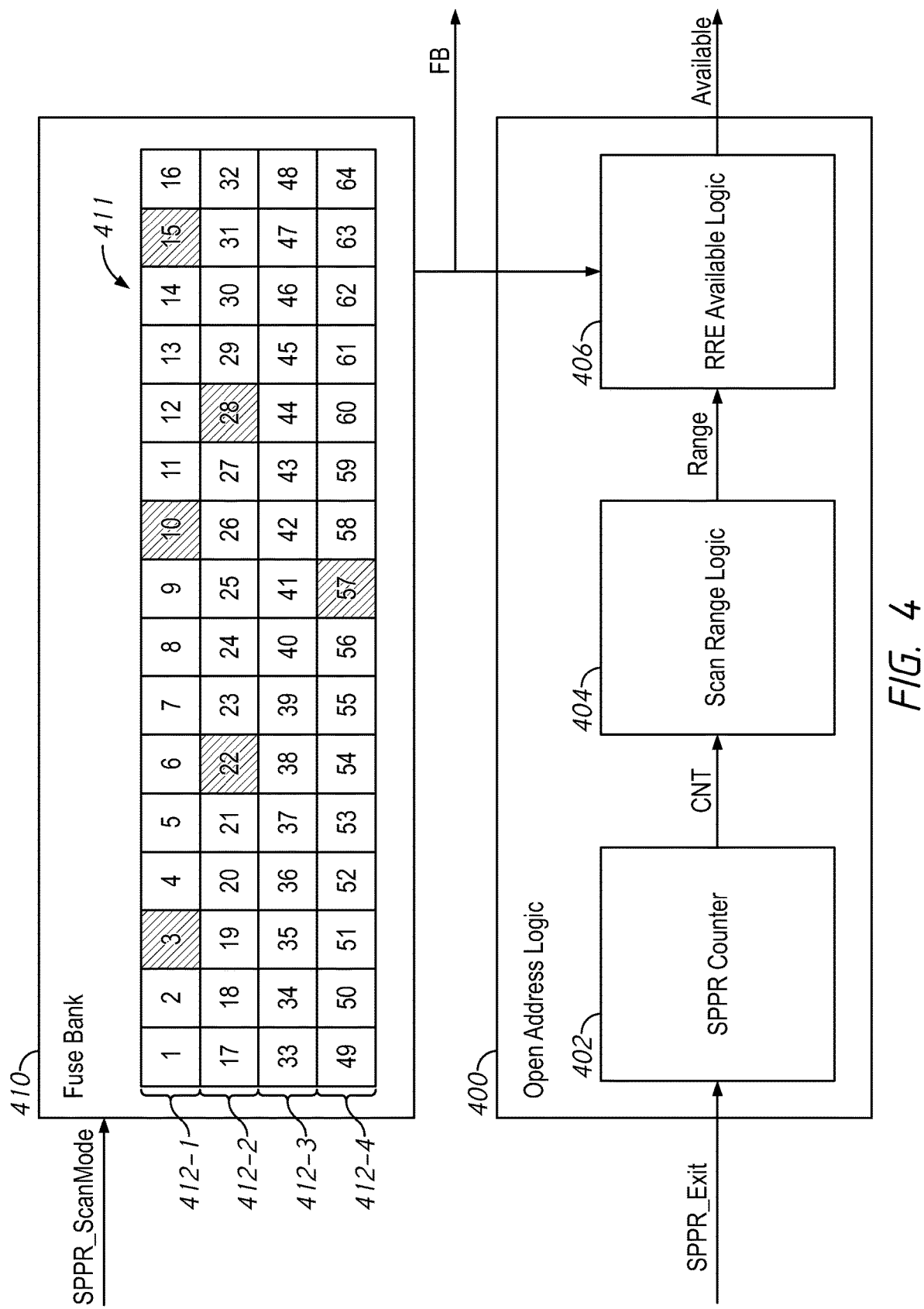
FIG. 4 is a block diagram of open address logic according to some embodiments of the present disclosure.

FIG. 4 is a block diagram of open address logic according to some embodiments of the present disclosure. The open address logic 400 accesses a fuse bank 410 of a fuse array (e.g., a fuse bank within fuse array 125 of FIG. 1) to locate open RREs. For the purposes of FIG. 4, only a single fuse bank 410 is shown, however it should be understood that the fuse array may include many fuse banks, each associated with a respective memory bank. Similarly, there may be multiple open address logic circuits 400, each associated with a different fuse bank, and each including a respective counter which tracks the number of SPPR operations which have been performed on that memory bank and fuse bank. However, for the sake of brevity, only a single fuse bank 410 and open address logic 400 are discussed with respect to FIG. 4.

The fuse bank may receive a scan mode signal SPPR_ScanMode which causes the fuse bank to broadcast information along the fuse bus FB. The fuse bank 410 includes a number of RREs 411, each of which may be associated with a redundant row of the bank and may be used to perform a repair operation. For illustrative purposes, the RREs 411 are represented as boxes (here labelled 1 to 64 to represent their FBAs). Each RRE 411 may represent a set of fuses which can be used to encode a row address (e.g., as part of a hard repair or PPR operation). Each RRE 411 may be identified by a FBA. For the sake of simplicity the labels 1 to 64 will be used to represent the FBA of a given RRE 411, however it should be understood that a memory may use more complex schemes to encode the FBAs.

The open address logic 400 may examine information along a fuse bus FB during a scan mode to locate open RREs. The open address logic 400 may search for open RREs within a zone or portion 412 of the fuse bank 410 (e.g., within a given range of values of the FBA). Each time an SPPR operation is performed, a different portion 412 of the fuse bank 410 may be searched. Each portion 412 may be a non-overlapping zone, such that a given RRE is associated with exactly one portion 412.

The open address logic 400 includes an SPPR counter 402 (or zone counter) which manages a count value CNT which represents a number of SPPR operations which have been performed. The SPPR counter may initialize (e.g., at power up) to an initial value (e.g., 0) associated with a first portion 412-1 of the RREs 411 of the fuse bank. Each time a SPPR_Exit signal is received indicating that an SPPR operation has been completed, the count value CNT may be changed (e.g., incremented) to a new value associated with a different portion of the RREs 411 of the fuse bank 410. The SPPR counter may be a multi-bit counter, with a number of bits based on a number of portions in the fuse bank 410. In the example of FIG. 4, where there are four different portions 412-1 to 412-4, a two bit counter may be used. The number of portions may, in turn, be based on (or may define) a number of SPPR operations which are supported. For example, if there are four portions 412-1 to 412-4, then four SPPR operations may be performed on the fuse bank 410. Other numbers of portions and other sizes of the counter 402 may be used in other example embodiments.

The open address logic 400 includes scan range logic 404 which determines which RREs are being scanned based on the value CNT from the SPPR counter 402. For example, the scan range logic may indicate a range of FBAs based on the current value of the count CNT. The scan range logic 404 may provide range signals Range to the RRE availability logic 406 which indicate FBA values which are part of the current portion 412 indicated by CNT.

In the example illustrated in FIG. 4, there are 64 total RREs in the fuse bank 410, divided into four portions 412 of 16 RREs each. The first portion 412-1 includes RREs with FBAs 1 to 16, the second portion 412-2 includes RREs with FBAs 17 to 32, the third portions 412-3 includes RREs with FBAs 33 to 48 and the fourth portion 412-4 includes RREs with FBAs 49 to 64. Different total numbers of RREs per fuse bank 410 and/or different ways of dividing RREs between portions may be used in other examples.

Each RRE 411 may include information, such as an enable bit, which indicates if that RRE 411 is open or if it has been used as part of a (hard) repair operation. It should be noted that the fuse bank 410 does not include information about whether or not the RRE 411 has been used as part of a soft repair operation, as a soft repair operation does not involve making changes to the state of the fuse bank 410. The use of non-overlapping portions 412 may help prevent an RRE which was used as part of a previous soft repair operation from being identified as part of a subsequent soft repair operation.

During a scan mode operation, information about the RREs such as their FBA and enable state may be streamed along the fuse bus FB. RRE available logic 406 of the open address logic 400 may check the enable states of RREs within a portion selected by the scan range logic 404 based on a state of the count CNT. So during a first SPPR operation (e.g., the count CNT is at an initial value) the range signal may indicate RREs with addresses 1 to 16 in the first portion 412-1. The RRE available logic 406 may check an enable state of the FBAs within that range, and ignore the states of FBAs which are out of that range. The first time an open RRE is located, the RRE available logic 406 may provide a signal Available at an active level. After the first SPPR is completed, the SPPR_Exit signal may be provided, the SPPR counter 402 changes the count value, and on a subsequent SPPR operation a different portion of the RREs may be scanned.

In the example of FIG. 4, the shaded RREs represent open RREs. Accordingly, during a first SPPR operation, the available signal may be provided at an active level when the FBA for RRE 3 is provided along the FB. During a second SPPR operation, the Available signal may be active responsive to RRE 22. During a third SPPR operation, the available signal will not be provided at an active level. During a fourth SPPR operation, the signal Available will be active responsive to RRE 57.

Figure 5:
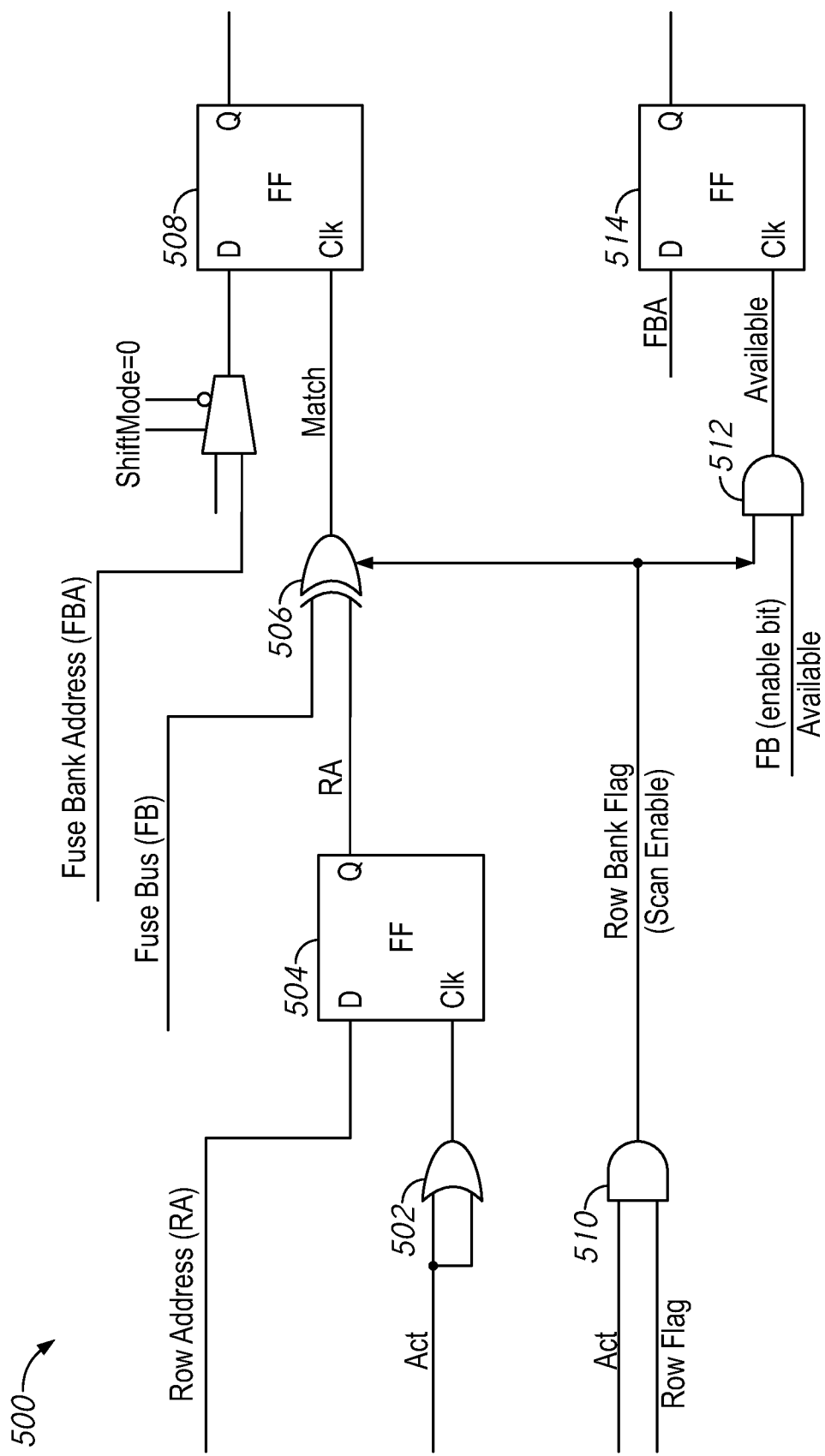
FIG. 5 is a schematic diagram of SPPR logic according to some embodiments of the present disclosure.

FIG. 5 is a schematic diagram of SPPR logic according to some embodiments of the present disclosure. The SPPR logic 500 may, in some embodiments represent an example implementation of a portion of the SPPR logic 300 of FIG. 3. Certain functions and signals have been omitted from the SPPR logic 500 for the sake of clarity.

The SPPR logic 500 includes an AND gate 510 which provides a Scan Enable signal to indicate that a scan mode is being performed and that the scan is covering the RREs of the current portion (e.g., as determined by the count CNT of FIG. 4). The AND gate 510 receives input signals ACT and Row Flag. The signal ACT may be used in certain modes to indicate that the scan is happening. The signal Row Flag may represent the signal Range of FIG. 4, and may be active when the scan is occurring over the RREs of the current portion. Accordingly, the signal Scan Enable may only be active when a scan is occurring and when it is happening to the current portion.

A second AND gate 512 may act as the RRE available logic 406 of FIG. 4. The AND gate 512 receives the Scan Enable signal and an enable bit from the fuse bus FB. The enable bit may be active when an RRE currently on the FB is open. Accordingly, the AND gate 512 may provide a signal Available at an active level only when the Scan Enable signal is active and when the enable bit indicates that the current RRE being scanned is available.

The signal Available is coupled to the clock gate of a latch 514, which may act as the open address latch 354 of FIG. 3. The input terminal D of the latch 514 is coupled to the fuse bus address FBA along the fuse bus FB. When the Available signal is active, indicating that the current RRE along the FB is open, the latch 514 may latch the value of that RRE's FBA (e.g., Hit2FBA of FIG. 3).

The SPPR logic 500 also includes circuits for detecting a bad redundant row. A latch 504 may be used to store a row address RA which is being provided as the repair address (e.g., the row which has been identified as defective and is intended for repair as part of the SPPR operation. The latch 504 has a clock terminal coupled through an OR gate 502 to the signal ACT. The clock terminal may be activated when the ACT signal indicates that the address RA is being provided.

The row address RA stored in the latch 504 is provided to an input of an $XOR|_{[CM1]}$gate 506 which has a second input coupled to the fuse bus FB. The XOR gate 506 may compare the value on the XOR bus to the row address RA. The values on the FB may represent row addresses which have been encoded into RREs of the fuse bus. Accordingly, if there is a match, it may indicate that the row address RA was previously repaired, and the signal Match may be provided at an active level. It is important to note that the operation of the XOR gate 506 is not dependent on the row flag signal. Accordingly, all RREs may be compared to the RA, rather than just the portion of the RREs which are currently being searched for an open RRE. When the match signal is active, the current FBA may be latched in a latch 508 (e.g., latch 348 of FIG. 3).

Figure 6:
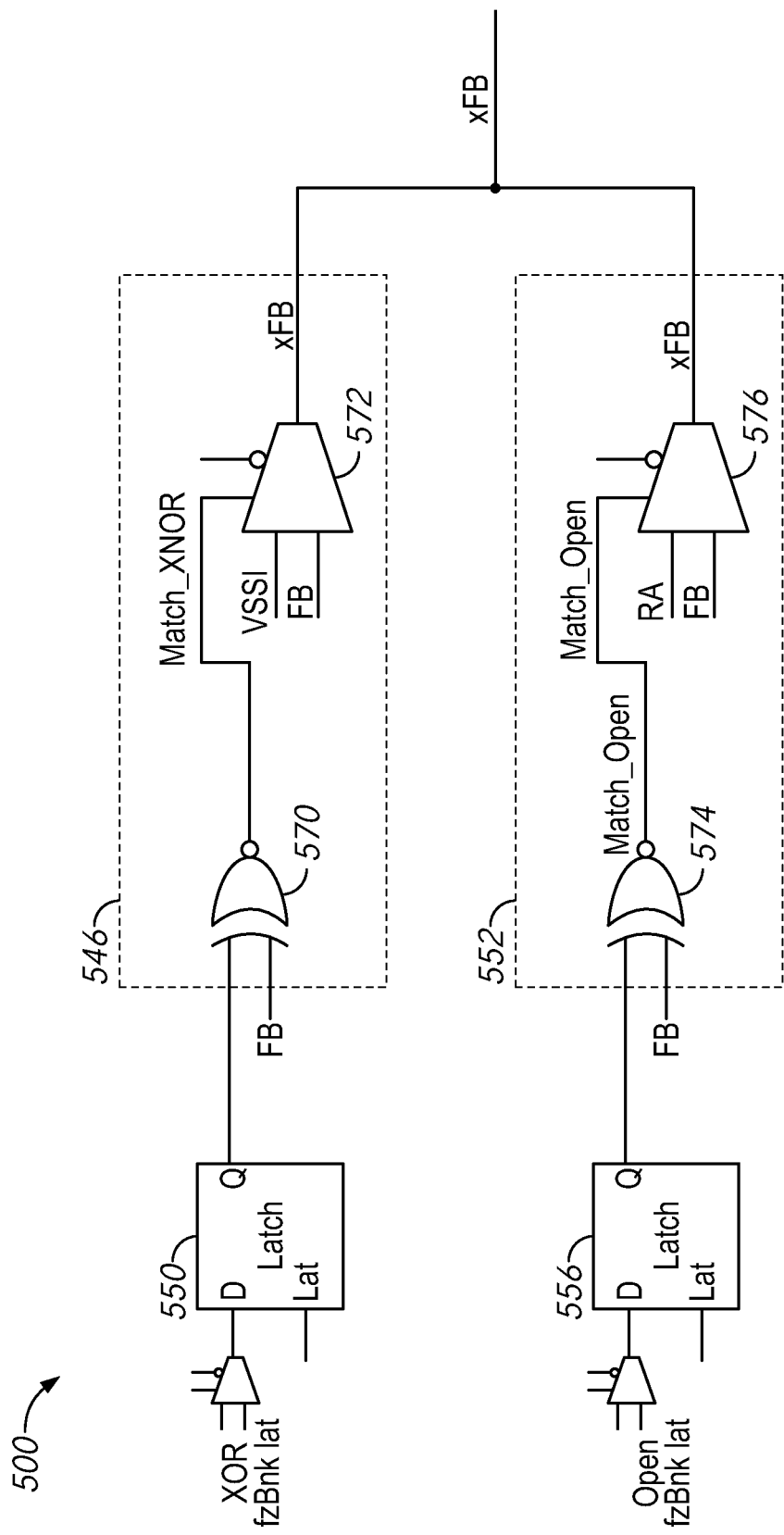
FIG. 6 shows a portion of a fuse logic circuit according to some embodiments of the present disclosure.

FIG. 6 shows a portion of a fuse logic circuit according to some embodiments of the present disclosure. The fuse logic circuit 600 shows certain components which may implement components of the fuse logic circuit 126 of FIG. 1 and/or 226 of FIG. 2. In particular the fuse logic circuit 600 shows components which may be used during a soft send mode operation to perform soft repairs on the memory. The components of the fuse logic circuit 600 may work in conjunction with the components of logic circuits 300 of FIG. 3 and/or 500 of FIG. 5 to perform an SPPR operation.

The fuse logic circuit 600 includes a bad redundant latch 650 (e.g., 348 of FIG. 3 and/or 508 of FIG. 5) and an open address latch 656 (e.g., 352 of FIG. 3 and/or 514 of FIG. 5). The output terminal of the bad redundant latch 650 is coupled to an SPPR disable circuit 646 (e.g., 346 of FIG. 3), while the output terminal of the open address latch 656 is coupled to an SPPR repair circuit 652 (e.g., 352 of FIG. 3).

The SPPR disable circuit 646 includes an XNOR gate 670 which is coupled to the address stored in the latch 650 and to the fuse bus FB. When the address on the fuse bus FB matches the bad redundant address stored in the latch 650, the XNOR gate 670 may provide the signal Match_XNOR at an active level. The signal Match_XNOR being at an active level may activate the multiplexer 672. The multiplexer 672 may receive the fuse bus FB and also a system voltage VSS!. When the multiplexer 672 is activated by the signal Match_XNOR, the multiplexer 672 may change the value of an enable bit of the current address on the fuse bus FB to the value of the system voltage VSS!. This may change the state of the enable bit such that the current value of the address is now inactive. The updated address may then be provided along the updated fuse bus xFB.

The SPPR repair circuit 652 includes an XNOR gate 674 which is coupled to the fuse bus FB and to the address stored in the latch 656. When the value of the fuse bus FB matches the address in the latch 656, the XNOR gate 674 may provide the signal Match_Open at an active level. The signal Match_Open being at an active level may activate the multiplexer 676. The multiplexer 676 may be coupled to the fuse bus FB and the identified bad address RA. When the multiplexer 676 is activated, it may provide RA on the updated fuse bus xFB instead of the value that was previously on FB.

Figure 7:
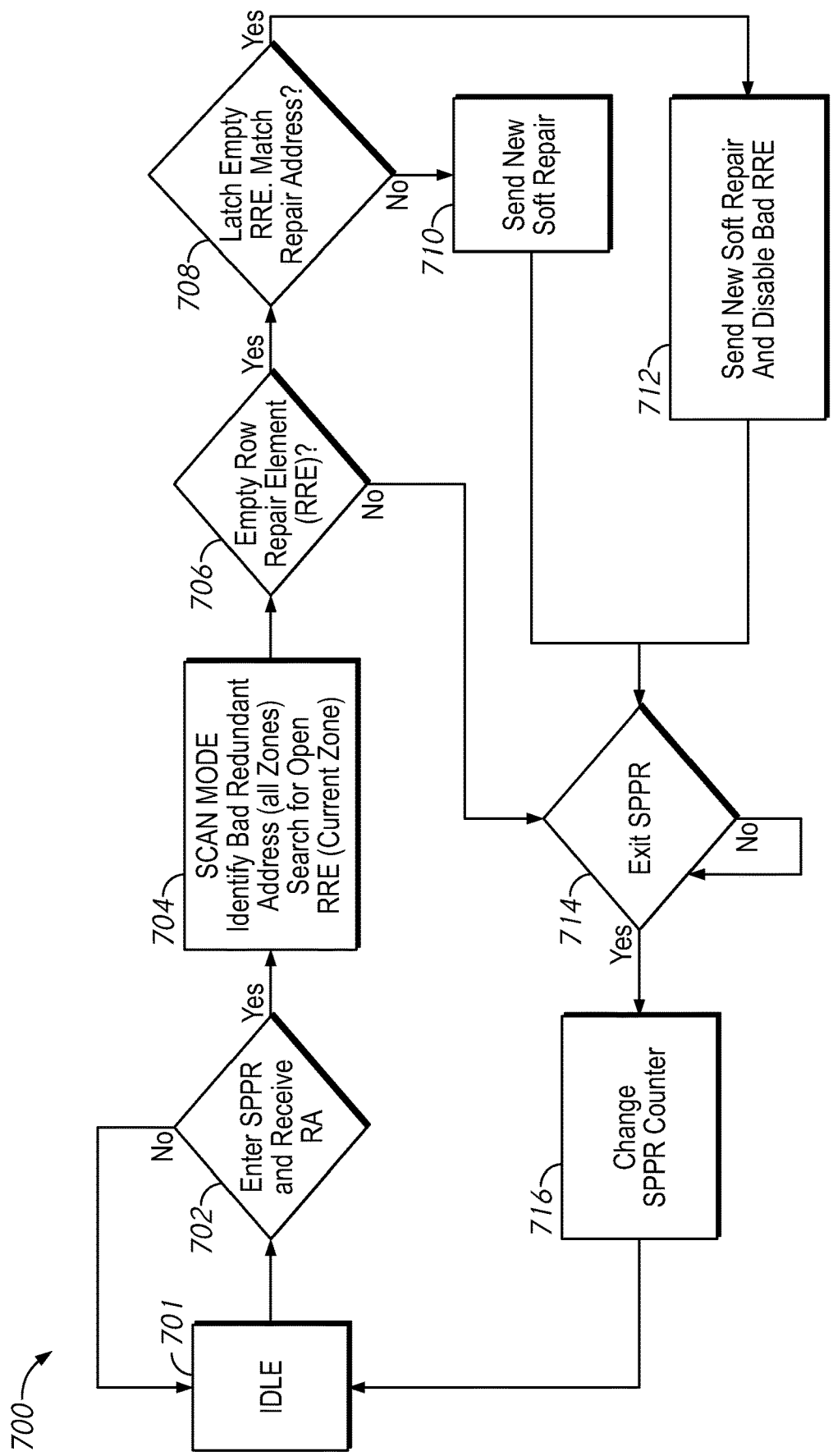
FIG. 7 is a flow chart of a method according to some embodiments of the present disclosure.

FIG. 7 is a flow chart of a method according to some embodiments of the present disclosure. The method 700 may, in some embodiments, be implement by one or more of the components described in FIGS. 1-6. The method 700 represents a method of performing a SPPR operation in a memory. The method 700 may generally represent an SPPR operation associated with a particular bank of the memory.

The method 700 may generally begin at block 701, which describes the memory device being in an idle state. In the idle state, the memory may be available to perform various operations and/or enter different modes, such as the SPPR mode as described herein. Block 702 describes entering the SPPR mode. Entering the SPPR mode includes providing a command to the memory (e.g., an SPPR entry command). In some embodiments, the SPPR mode may be a protected mode of the memory. To enter the SPPR mode, guard keys may be required to unlock access to the SPPR mode. If the SPPR command is not entered, or (if required) the guard keys are entered incorrectly, the memory may return to the idle state (e.g., back to block 701). Entering the SPPR mode may also include receiving a repair address (RA of FIGS. 3 and 5). If the SPPR entry command is properly provided (and if required, the guard keys are properly provided), the method 700 may proceed to block 704.

Block 704 describes performing a scan mode operation. The scan mode may include identifying a bad row address (if any) and searching for an open RRE in a current zone (or portion) of the fuse bank. Identifying the bad row address may include comparing the addresses along the fuse bus to the repair address (for example, with bad redundant logic 342 of FIG. 3). The addresses along the fuse bus may represent previous repair addresses which were repaired by changing one or more fuses (e.g., as part of a hard repair operation). If there is a match between the address on the fuse bus and the repair address RA, the fuse bus address may be latched (e.g., in bad redundant latch 348 of FIG. 3). The bad redundant scan operation may take place across all the zones of a fuse bank (e.g., all RREs).

The scan mode of block 704 may also include searching for open RREs in a current zone of the memory. The method 700 may include counting a number of SPPR operations (e.g., in an SPPR counter 402 of FIG. 4) which may track a number of times that an SPPR operation has been performed. The count may determine a zone of the fuse bank (e.g., a selected portion of the RREs in the fuse bank) to search for an open RRE. For example, the count may be used to determine a range of FBAs within the fuse bank, and only RREs with FBAs within that range may be searched.

Block 706 describes determining if there is an empty RRE within the currently searched zone. For example, an enable bit streamed along the fuse bus may be check to determine if the RRE associated with that enable bit is open or not. If no open RRE is detected, then the method 700 may proceed to block 714 which exits SPPR mode. If there is an open RRE, the method 700 may proceed to block 708, which describes latching the FBA of the open RRE in a latch (e.g., in open address latch 354 of FIG. 3).

If no bad redundant addresses were identified (in block 704) then block 708 may proceed to block 710, which describes performing a soft send operation. During the soft send operation, information from the fuse array may be streamed along the fuse bus and stored in the row latches (e.g., 119 of FIG. 1). When the FBA along the FB matches the FBA stored in the open address latch (e.g., 354 of FIG. 3), the information along the FB may be replaced with the RA (e.g., by SPPR repair circuit 352). Accordingly, the row address RA may be latched in the row latch associated with the open RRE.

If a bad redundant address was identified (in block 704) then block 708 may proceed to block 712 which describes performing a soft repair operation and disabling the bad RRE. The soft send operation may be performed in a fashion similar to the process described with respect to block 710. In addition, in block 712, disable logic (e.g., 346 of FIG. 3) may disable the row that the RA was previously repaired to.

Blocks 710 and 712 may both be followed by block 714 which describes exiting SPPR mode. In some embodiments, SPPR mode may exited immediately. In some embodiments, the memory device may hold on block 714 until it is ready to exit the SPPR mode.

Block 714 may be followed by block 716 which describes changing an SPPR count value. For example, the SPPR count value may be incremented. After the SPPR count value is updated, the memory may return to an idle state (e.g., block 701). Each bank of the memory array may be associated with a different count value (e.g., stored in a different counter). Accordingly, each count value may represent a number of SPPR operations performed in that bank.

The method 700 may allow for the interleaving of SPPR commands to different banks. For example, a first SPPR operation may be performed on a first bank of the memory array, a second SPPR operation may be performed on a second bank of the memory array, and a third SPPR operation may be performed on the first bank. This is possible, at least in part, because each bank may have separate counters to ensure that when SPPR operations return to a bank which previously had an SPPR operation, the new SPPR operation will take place in a zone of the fuse bank which is unique to that SPPR operation in that bank. In certain previous SPPR methods, it may not have been possible to interleave bank repairs, since those solutions searched the entire fuse bank for open RREs. Accordingly, returning to a previously repaired bank would lead to situations where an RRE used for the first SPPR operation would be incorrectly identified as open for the second SPPR operation. In the present method 700, each bank tracks which zone of the respective fuse bank should be searched on each new SPPR operation, which prevents inadvertently identifying the same RRE as open in different SPPR operations.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. A method comprising:
   performing a first soft post package repair (SPPR) operation, wherein the first SPPR operation includes:
      scanning a first portion of a fuse bank to determine if there is a first open redundant row based on a value of a counter; and
      repairing a first repair address by mapping the first repair address to the first open redundant row available for the first SPPR operation;
   updating the value of the counter after performing the first SPPR operation; and
   performing a second SPPR operation, wherein the second SPPR operation includes:
      scanning a second portion of the fuse bank, based on the updated value of the counter, to determine if there is a second open redundant row, wherein the second portion of the fuse bank is non-overlapping with the first portion of the fuse bank; and
      repairing a second repair address by mapping the second repair address to the second open redundant row available for the second SPPR operation.

2. The method of claim 1, wherein performing the first SPPR operation and the second SPPR operation each includes determining if the first repair address and the second repair address respectively are associated with a bad redundant address.

3. The method of claim 2, wherein determining if the first and the second repair addresses are associated with the bad redundant address in both the first SPPR operation and the second SPPR operation includes scanning the first portion and the second portion.

4. The method of claim 2, further comprising disabling a redundant row associated with the bad redundant address.

5. The method of claim 1, further comprising:
   latching a fuse bank address (FBA) associated with the first open redundant row in an open address latch;
   comparing addresses along a fuse bus to the latched FBA; and
   replacing the address along the fuse bus with the first row repair address when there is a match between one of the addresses along the fuse bus and the latched FBA.

6. An apparatus comprising:
   a fuse bank comprising a plurality of redundant repair elements (RREs), each associated with a redundant row of memory;
   open address logic configured to scan a selected portion of the plurality of RREs for an open RRE associated with an open redundant row of memory as part of a soft post package repair (SPPR) operation, wherein the portion of the fuse bank is selected based on a count of the number of SPPR operations; and
   a repair logic circuit configured to remap a repair address to the open redundant row of memory based on the open RRE, wherein the open RRE and the open redundant row are indicative of being available for the SPPR operation.

7. The apparatus of claim 6, further comprising a counter configured to update a count value each time the SPPR operation is exited, wherein the open address logic is configured to select the portion based on the count value.

8. The apparatus of claim 6, further comprising bad redundant address logic configured to determine if the repair address is associated with a bad redundant row of memory.

9. The apparatus of claim 8, further comprising SPPR disable logic configured to disable the bad redundant row of memory.

10. The apparatus of claim 6, further comprising an open address latch configured to store a fuse bus address (FBA) associated with the open RRE.

11. The apparatus of claim 10, wherein repair logic circuit is configured to compare addresses along a fuse bus to the stored FBA in the open address latch, and when there is a match replace data along the fuse bus associated with the stored FBA with the repair address.

12. The apparatus of claim 6, wherein the portion of the plurality of RREs selected by the open address logic is non-overlapping with any other selectable portion of the plurality of RREs.

13. A method comprising:
performing a soft post package repair (SPPR) operation comprising:
scanning a selected portion of a fuse bank for an open redundant repair element (RRE), wherein the portion is selected based on a count value, and wherein the open RRE is available for the SPPR operation;
mapping a repair address to the open RRE;
updating the count value responsive to performing the soft post package repair operation.

14. The method of claim 13, wherein each selected portion is non-overlapping with other selected portions.

15. The method of claim 13, further comprising latching a fuse bank address (FBA) associated with the open RRE.

16. The method of claim 15, wherein the mapping comprises:
comparing data along a fuse bus to the latched FBA;
replacing the data with the repair address when there is a match with the latched FBA.

17. The method of claim 16, further comprising:
latching the repair address in a row latch associated with a redundant row of a memory array; and
accessing the redundant row based on the latched repair address.

18. The method of claim 13, wherein performing the SPPR operation further comprises determining if the bad row address is associated with a bad redundant row; and
disabling the bad redundant row.

19. The method of claim 13, wherein the count value has a number of values based on a number of SPPR operations which can be performed.

* * * * *